United States Patent
Mio

(10) Patent No.: US 6,320,791 B1
(45) Date of Patent: *Nov. 20, 2001

(54) WRITING APPARATUS FOR A NON-VOLATILE SEMICONDUCTOR MEMORY DEVICE

(75) Inventor: Yuichiro Mio, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/418,574

(22) Filed: Oct. 15, 1999

(30) Foreign Application Priority Data

Oct. 26, 1998 (JP) ................................. 10-303529

(51) Int. Cl.$^7$ .................................................. G11C 16/06
(52) U.S. Cl. ............................. 365/185.22; 365/185.24; 365/185.04; 365/230.03
(58) Field of Search ..................... 365/185.22, 185.24, 365/185.04, 230.01, 230.03, 230.08

(56) References Cited

U.S. PATENT DOCUMENTS

| | | | |
|---|---|---|---|
| 5,170,157 | * 12/1992 | Ishii et al. | 365/189.05 |
| 5,361,227 | * 11/1994 | Tanaka et al. | 365/189.01 |
| 5,574,684 | * 11/1996 | Tomoeda | 365/185.04 |
| 5,787,484 | * 7/1998 | Norman | 711/159 |
| 5,825,690 | * 10/1998 | Saitoh | 365/185.22 |
| 5,974,579 | * 10/1999 | Lepejian et al. | 365/201 |
| 6,016,560 | * 1/2000 | Wada et al. | 365/195 |
| 6,047,352 | * 4/2000 | Lakhani et al. | 365/185.11 |
| 6,081,454 | * 6/2000 | Ohuchi et al. | 365/185.22 |

FOREIGN PATENT DOCUMENTS

| | | |
|---|---|---|
| 3-295098 | 12/1991 | (JP) . |
| 5-159587 | 6/1993 | (JP) . |
| 5-290585 | 11/1993 | (JP) . |
| 6-76586 | 3/1994 | (JP) . |
| 6-187791 | 7/1994 | (JP) . |
| 7-130200 | 5/1995 | (JP) . |
| 8-195094 | 7/1996 | (JP) . |
| 10-112196 | 4/1998 | (JP) . |
| 10-134588 | 5/1998 | (JP) . |

* cited by examiner

*Primary Examiner*—Richard Elms
*Assistant Examiner*—VanThu Nguyen
(74) *Attorney, Agent, or Firm*—McGuireWoods LLP

(57) ABSTRACT

A writing apparatus for a non-volatile semiconductor memory device in which data is written into a flash memory 11 and written data being verified, whereby only data not having been written properly in the memory 11 is rewritten therein, wherein the writing apparatus comprising exclusive-NOR circuit 51₁–51*n* which compares write data 31D with verified data 41D and generates write data 51D to be rewritten thereinto, based on a result of the comparison.

15 Claims, 8 Drawing Sheets

WRITING APPARATUS FOR A NON-VOLATILE SEMICONDUCTOR MEMORY DEVICE

BACKGROUND OF THE INVENTION

1. Field of the Invention

The present invention relates to a writing apparatus for a non-volatile semiconductor memory device, and more particularly to a non-volatile semiconductor memory device with an extended lifetime because of prevention of excessive writing.

2. Background of the Invention

In recent years, flash memories have come into widespread use as electrically re-writable non-volatile semiconductor memory devices. An example of a flash memory of the past is noted in the Japanese Unexamined Patent Publication (KOKAI) No. 07-36787, the flash memory disclosed in that publication being shown in FIG. 9.

The flash memory device shown in FIG. 9 has a plurality of flash memories, wherein verification is performed when performing a write operation and, if a write operation fails, only the memory that had the failed write operation is written again.

In the above-noted flash memory device, however, when a write operation fails, because data is written into the entirety of one flash memory, there is the problem of excessive writing, this leading to a shortening of the life of the flash memory.

SUMMARY OF THE INVENTION

Accordingly, it is an object of the present invention to improve on the above-noted drawback in the prior art, by providing a novel non-volatile semiconductor memory device writing apparatus which extends the life of a semiconductor memory device by preventing excessive writing.

Another object of the present invention is to provide a novel non-volatile semiconductor memory device writing apparatus, wherein a large-capacity flash memory is divided into blocks and each block is written into simultaneously so as to shorten the writing time, and reduce a number of cells connected to each bit line or word line, thereby reducing the number of times stress is applied to a selected cell.

To achieve the above-noted object, the present invention has the following basic technical constitution.

Specifically, the first aspect of the present invention is a writing apparatus for a non-volatile semiconductor memory device in which data is written into a flash memory and written data being verified, whereby only data not having been written properly in the memory is rewritten therein, wherein the writing apparatus comprising exclusive-NOR circuit which compares write data with verified data and generates write data to be rewritten thereinto, based on a result of the comparison.

In the second aspect of the present invention, the exclusive-NOR circuit comprises a plurality of exclusive-NOR circuits, the number of which being identical to that of the write data.

In the third aspect of the present invention, the write data is stored in a data buffer while a data read out for being verified, is stored in a read buffer.

The fourth aspect of the present invention is a writing apparatus for a non-volatile semiconductor memory device in which data is written into a flash memory and written data being verified, whereby only a data not having been written properly in the memory is rewritten therein, wherein this writing apparatus comprises a plurality of flash memories.

The fifth aspect of the present invention is a writing apparatus for a non-volatile semiconductor memory device in which data is written into a flash memory and written data being verified, whereby only data not having been written properly in the memory is rewritten therein, wherein a plurality of the flash memories are provided and each one of the flash memories comprising a data buffer to store write data, a read buffer to store read-out data and a write controlling means for simultaneously writing each data stored in the respective data buffers into the respective memories, and further wherein the writing apparatus being provided with an address buffer for designating a same address for each memory, the write controlling means being provided with a plurality of exclusive-NOR circuits the number of which being identical to that of write data, the exclusive-NOR circuit comparing the write data with verified data and generating write data to be rewritten thereinto, based on a result of the comparison so that rewriting operation is carried out.

A non-volatile semiconductor memory device writing apparatus according to the present invention is one in which data is written into a flash memory and verified, wherein data that was verified as not having been written properly is written once again, this semiconductor memory device having a write signal generation means which compares the write data at an address with verification data and which re-writes only selected data bits that had not been completely written.

It is therefore possible to prevent excessive writing, thereby lowering the stress on the flash memory and enabling its life to be extended.

DESCRIPTION OF THE PREFERRED EMBODIMENTS

Preferred embodiments of a non-volatile semiconductor memory device writing apparatus according to the present invention are described in detail below, with references being made to relevant accompanying drawings.

Figure 1:
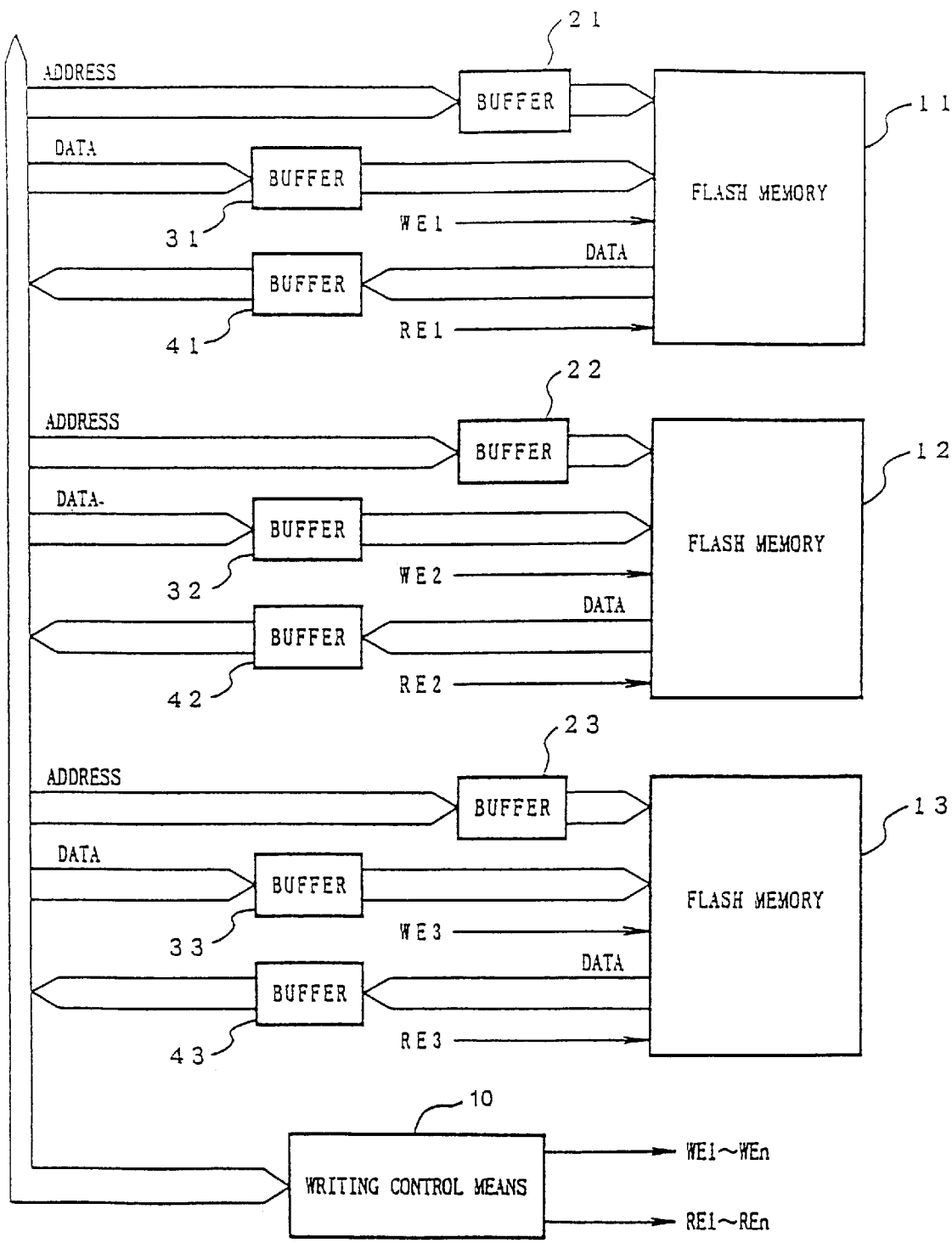
FIG. 1 is a block diagram that shows the first embodiment of a non-volatile semiconductor memory device according to the present invention.
Figure 3:
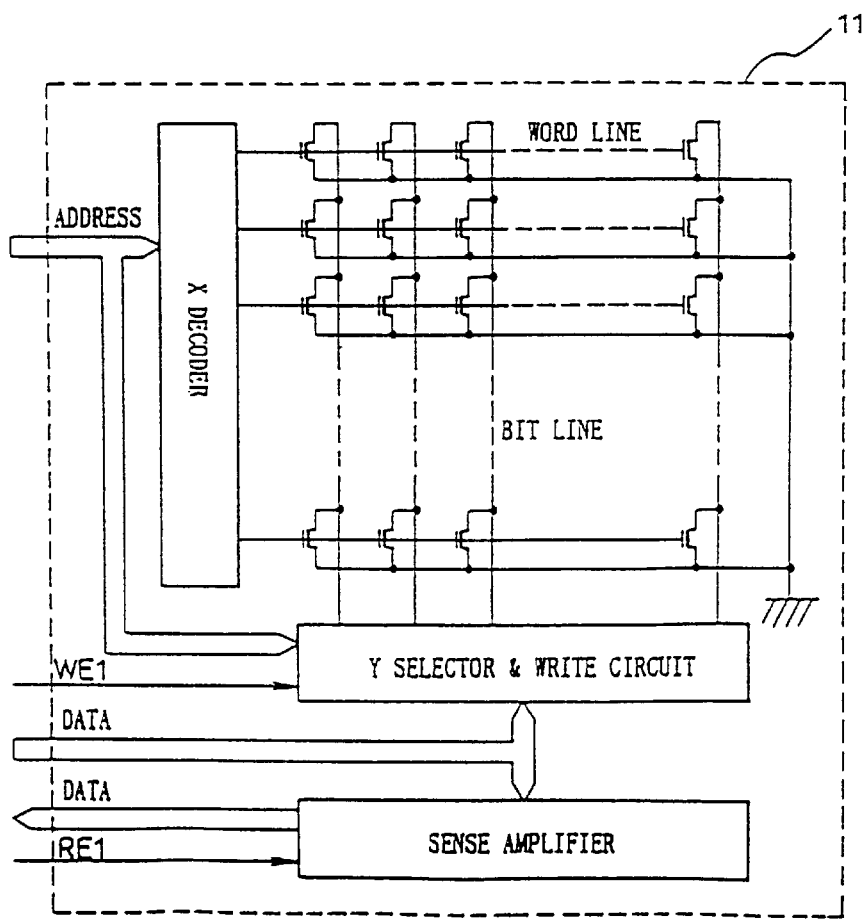
FIG. 3 is a block diagram that shows a flash memory.
Figure 4:
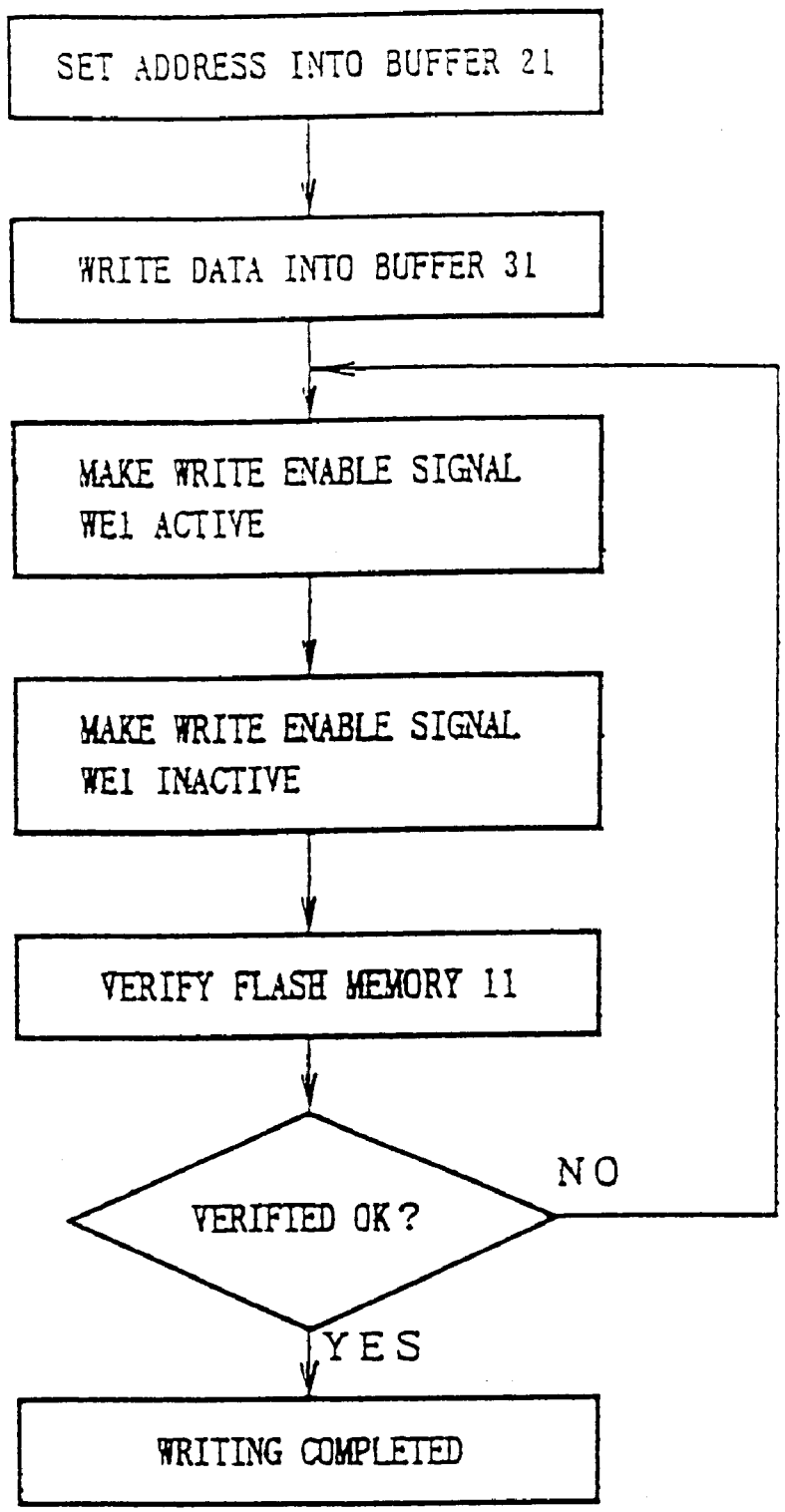
FIG. 4 is a flowchart that shows the write operation in the first embodiment.
Figure 5:
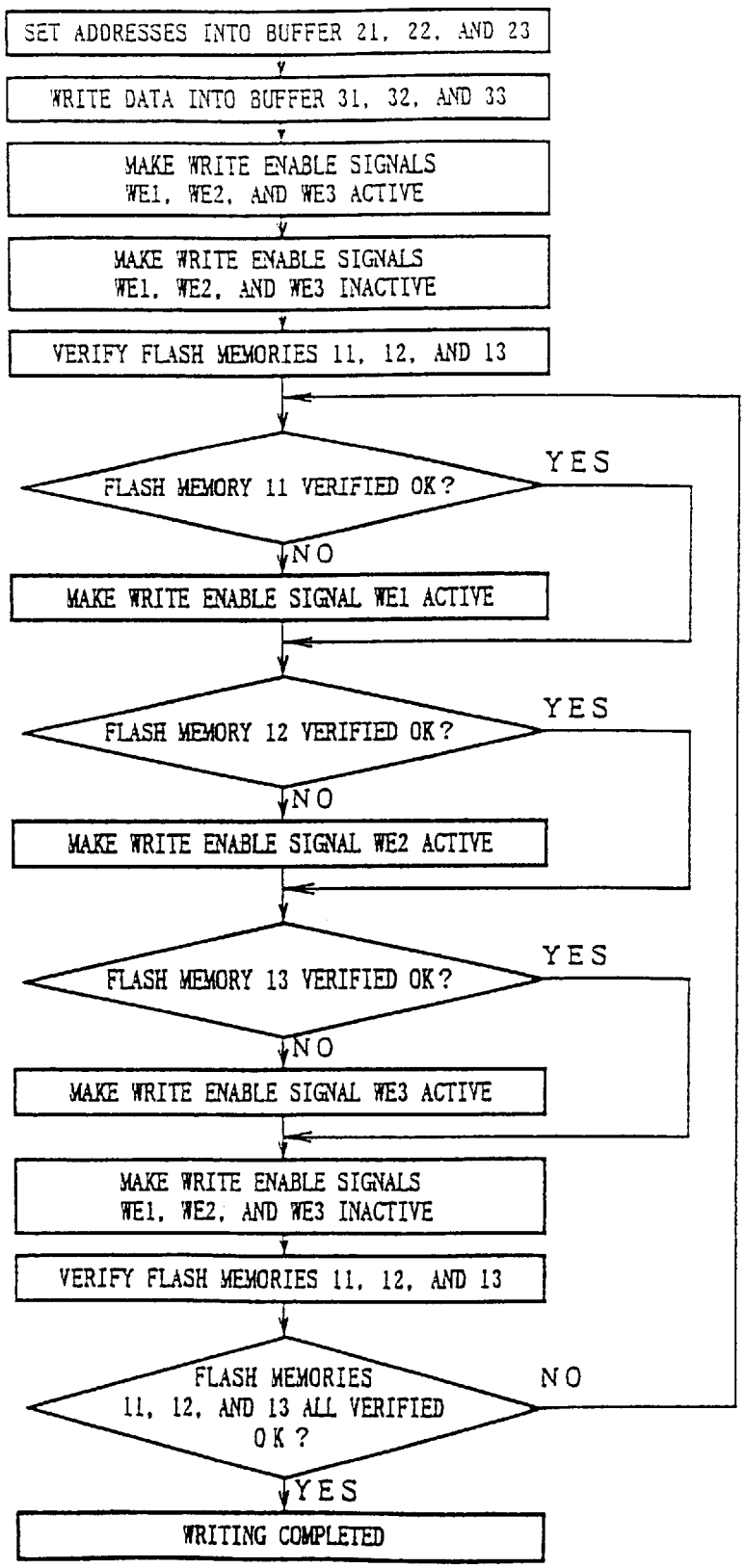
FIG. 5 is a flowchart that shows the write operation in the first embodiment.

FIG. 1 is a block diagram of the first embodiment of a non-volatile semiconductor memory device writing apparatus according to the present invention, FIG. 3 is a block diagram of a flash memory, and FIG. 4 and 5 are flowcharts that illustrate the write operation.

The embodiment shown in FIG. 1 has flash memory blocks 11, 12, and 13, respective address buffers 21, 22, and 23, and respective data buffers 31, 32, and 33. Each of the flash memory blocks is supplied the write enable signals WE1, WE2, and WE3 and the read enable signals RE1, RE2, and RE3. The write enable signals WE1, WE2, and WE3 are active when writing is performed, and the read enable signals RE1, RE2, and RE3 are active when read and verify are performed.

FIG. 3 shows an example of the configuration of a flash memory 11, this being the same configuration as the flash memories 12 and 13.

In the case of a configuration with 512 bit lines and 512 word lines, there are 512×512=262,144 cells, and for example, for a data bus with (word) of 32 bits, this would be a 32 bits×8192 words memory. This memory requires a 13-bit address width ($2^{13}$=8192 words), the upper-order 9 bits (for $2^9$=512 word lines) being connected to an X decoder, and the lower-order 4 bits (for 32 bits×$2^4$=512 word lines) being connected to a Y selector. When the write enable signals WE1 through WE3 are active, data is written into a cell that is selected by the X decoder and the Y selector. The read and verify operation are performed when the read enable signals RE1 through RE3 are active, the data from the cell selected by the X decoder and the Y selector being read out via a sense amplifier.

The operation of writing data by writing control means 10 into the flash memory 11 of a non-volatile semiconductor memory device configured as noted above is described below, with reference to the flowchart of FIG. 4.

First, an address is set into the address buffer 21, and data is written into the data buffer (write buffer) 31. Next, the write enable signal WE1 is made active and, after a prescribed amount of time has elapsed, the write enable signal is made inactive, and writing is completed. Then the read enable signal RE1 is made active, and verification of the written data is performed. If the data from the data buffer 31 had been written correctly, this completes the write operation. If data had not been written, however, the write enable signal WE1 is again set to active, and the write operation is repeated.

The first embodiment of the present invention writes data into the flash memories 11, 12, and 13 simultaneously, the writing operation being executed in accordance with the flowchart of FIG. 5.

First, addresses are set into the address buffers 21, 22, and 23, and data are written into the data buffers 31, 32, and 33, respectively. Next, the write enable signals WE1, WE2, and WE3 are made active and, after a prescribed amount of time has elapsed, these signals are made inactive, and the first writing into the flash memories 11, 12, and 13 is completed. Then, the read enable signals RE1, RE2, and RE3 are made active, and verification of the data written into the flash memories 11, 12, and 13 is performed. If the data from each of the data buffers had been written correctly, this completes the write operation. If a data write failed, however, the write enable signal for the flash memory which failed a write operation, is again made active and the write operation is repeated. Accordingly, only the memory that failed a write operation, is written again.

Thus, in this embodiment of the present invention the configuration is one in which a large-capacity memory is divided into independent blocks, into which writing is done simultaneously, thereby enabling a shortening of the write time, a reduction of the number of cells connected to one bit line or word line, and a reduction in the number of times stress is applied to a selected cell.

In this embodiment, because there are three blocks, the write time is reduced to one-third, and the number of times the stress that is applied to the bit lines or word lines, are reduced to one-third.

Figure 2:
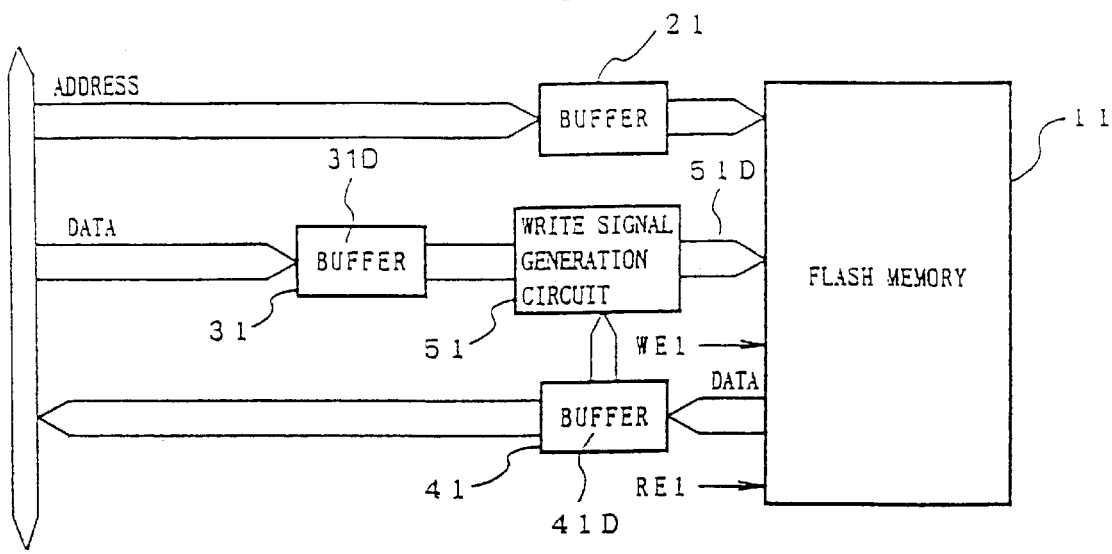
FIG. 2 is a block diagram that shows the second embodiment of a non-volatile semiconductor memory device according to the present invention.
Figure 6:
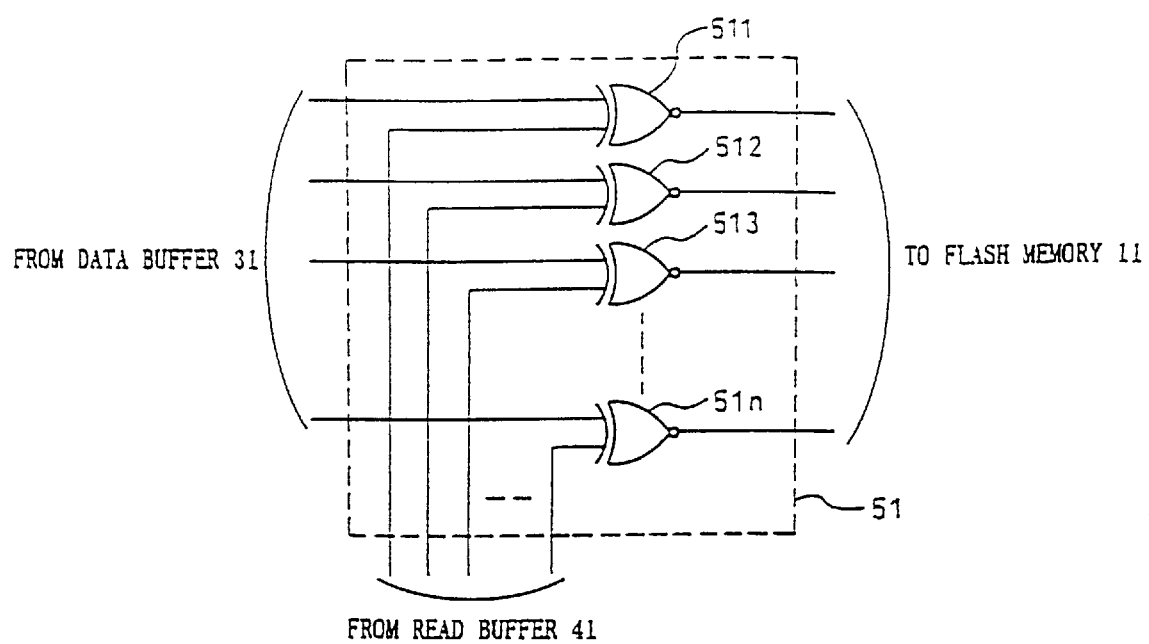
FIG. 6 is a circuit diagram of a circuit for generation of a write signal in the first embodiment.
Figure 7:
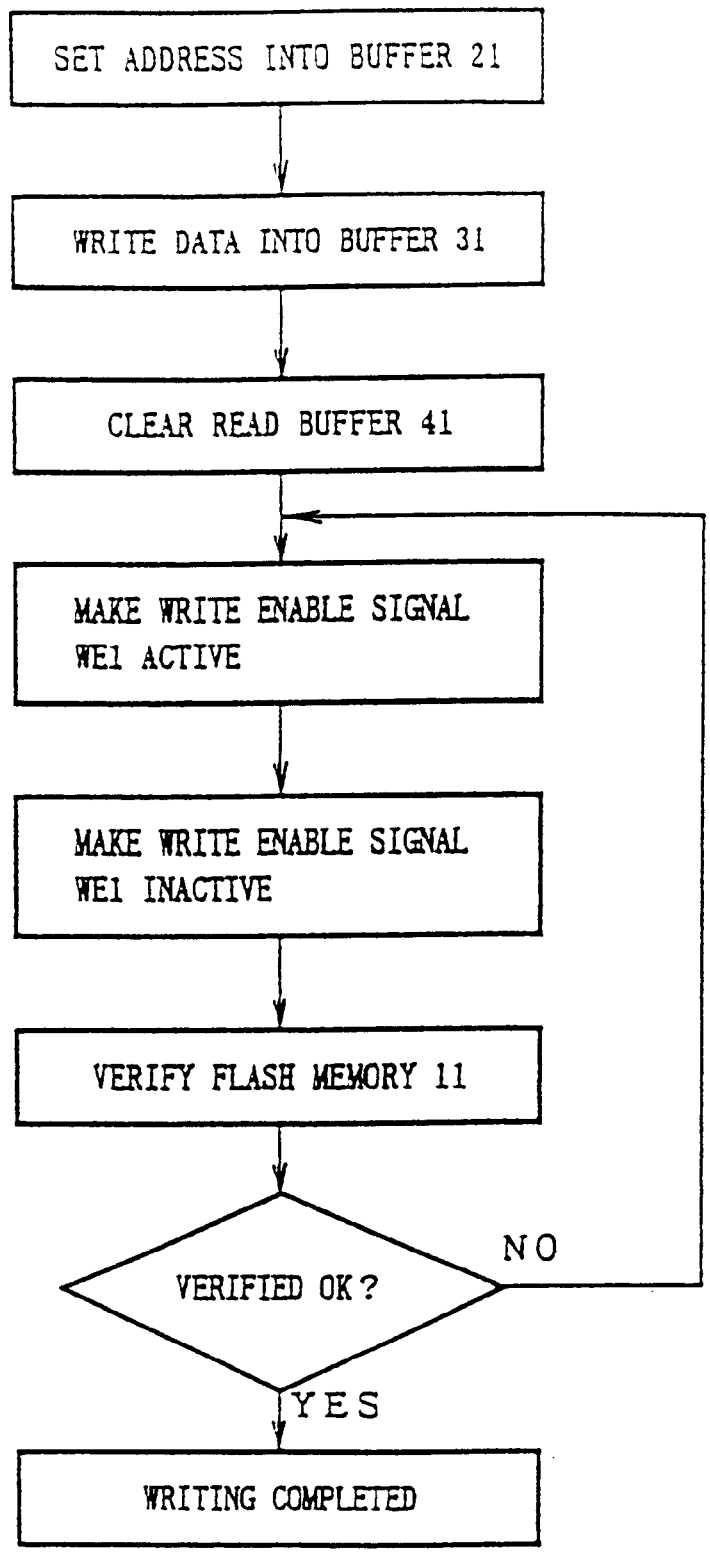
FIG. 7 is a flowchart that shows the write operation in the second embodiment.

FIG. 2 shows a block diagram of the second embodiment of a non-volatile semiconductor memory device writing apparatus according to the present invention, FIG. 6 is a circuit diagram of a write signal generation circuit, and FIG. 7 is an operational flowchart.

FIG. 2 and FIG. 6 show a non-volatile semiconductor memory device writing apparatus which writes data into the flash memory 11, and performs averify operation on the written data, re-writing data if the result of the verify operation indicates that the data was not correctly written, this writing apparatus being provided with a write signal generation means 51, which compares the write data for addresses with the verification data and selectively re-writes data at addresses that are verified as not having been written properly.

The write signal generation means 51 having exclusive-NOR circuits 511 through 51n compares each bit of write data 31D with each bit of verification data 41D, the output data 51D of which become re-written data.

In this writing apparatus, the above-noted write data is stored in the data buffer 31, and the readout data for verification is stored in the read buffer 41.

The present invention is described in more detail below.

Referring to FIG. 2, this embodiment of the present invention is formed by the flash memory 11, the address buffer 21, the data buffer 31, the read buffer 41, and the write signal generation circuit 51. The write enable signal WE1 and the read enable signal RE1 are each supplied to the flash memory 11. The write enable signal WE1 is active when writing, and the read enable signal RE1 is active when reading and verifying.

The flash memory 11 has the same configuration as described with regard to FIG. 1.

The read buffer 41 has the data of flash memory 11 read into when performing verification, a comparison being made at the write signal generation circuit 51 between a verification data and the write data, data being thereby generated so that only the bits that were not successfully written are re-written.

FIG. 6 shows the configuration of the write signal generation circuit 51. To examine each bits of data, the write signal generation circuit 51 is formed by n ex-NOR (exclusive NOR) circuits 511 through 51n. The write data and verify data are compared bit-for-bit by each of the ex-NOR circuits, and bits of data that are to be re-written are extracted, and these bits only are selected to be re-written. Accordingly, the write operation of this embodiment is as shown in FIG. 7.

First, an address is set into the address buffer 21, and data is written into the data buffer 31. Then the read buffer 41 is cleared and set to 1.

Next, after inputting data to the write signal generation circuit 51, the write enable signal WE1 is set made active and, after a prescribed amount of time has elapsed, the write enable signal WE1 is made inactive, this completing the first write operation. Next, the read enable signal RE1 is made active and verification is performed of the written data. When this is done, the read buffer 41 has verify data read into it.

In performing the verify operation, if all the data of the data buffer 31 is the same as the data in the read buffer 41, all the outputs of the ex-NOR circuits 51 1 through 51n will be at the high level, indicating that all bits were correctly written, at which point the write operation is completed. If, however, there is a low-level output among the outputs of the ex-NOR circuits 51 1 through 51n, this indicates that the bit for which the low-level output occurred was not fully written, in which case the write enable signal WE1 is made active again and writing is performed once again.

For example, if the write data was 00110001 and the verify data was 01111001, the outputs of the write signal generation circuit 51 will output 0 for the bits at which the data are different, that is, for bits for which the write operation failed, this output being 10110111. Therefore, the second write data is 10110111, it being sufficient to merely re-write the 0 bits. This means that bits of data that are to be re-written are extracted, and these extracted bits which indicates 0 are selectively re-written.

Because a flash memory is in the erased state, the data therein is 1, when performing a write operation, a failure to write a 0 can result in a readout verify data of 1. However, when 1 is to be written from the erased state, because the memory data is already 1, it cannot happen that the verify data is 0.

In this embodiment, therefore, because cells that have been successively written into cannot have data written into them, it is possible to prevent excessive writing, and to reduce the stress.

Figure 8:
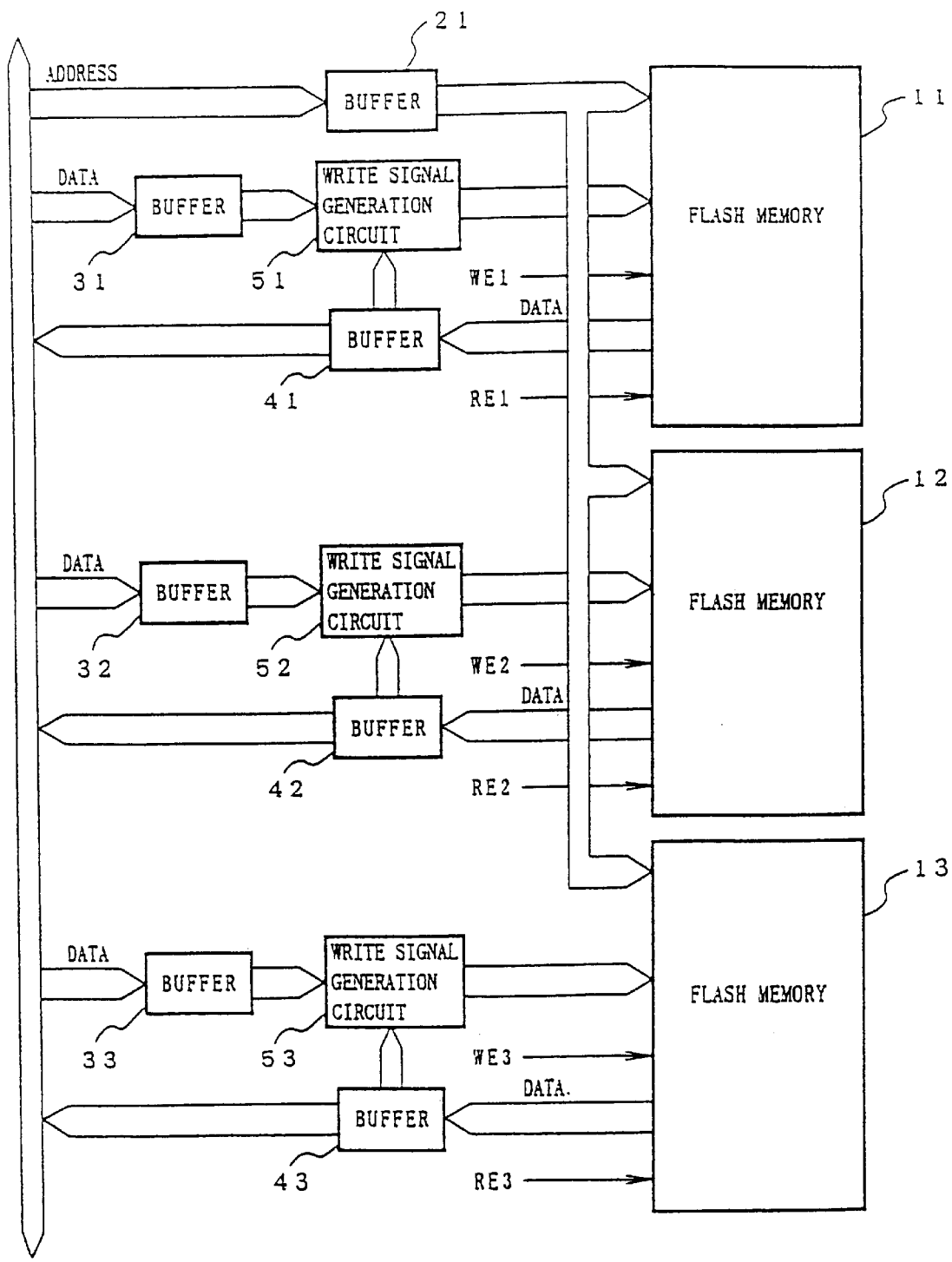
FIG. 8 is a block diagram that shows the third embodiment of a non-volatile semiconductor memory device according to the present invention.
Figure 9:
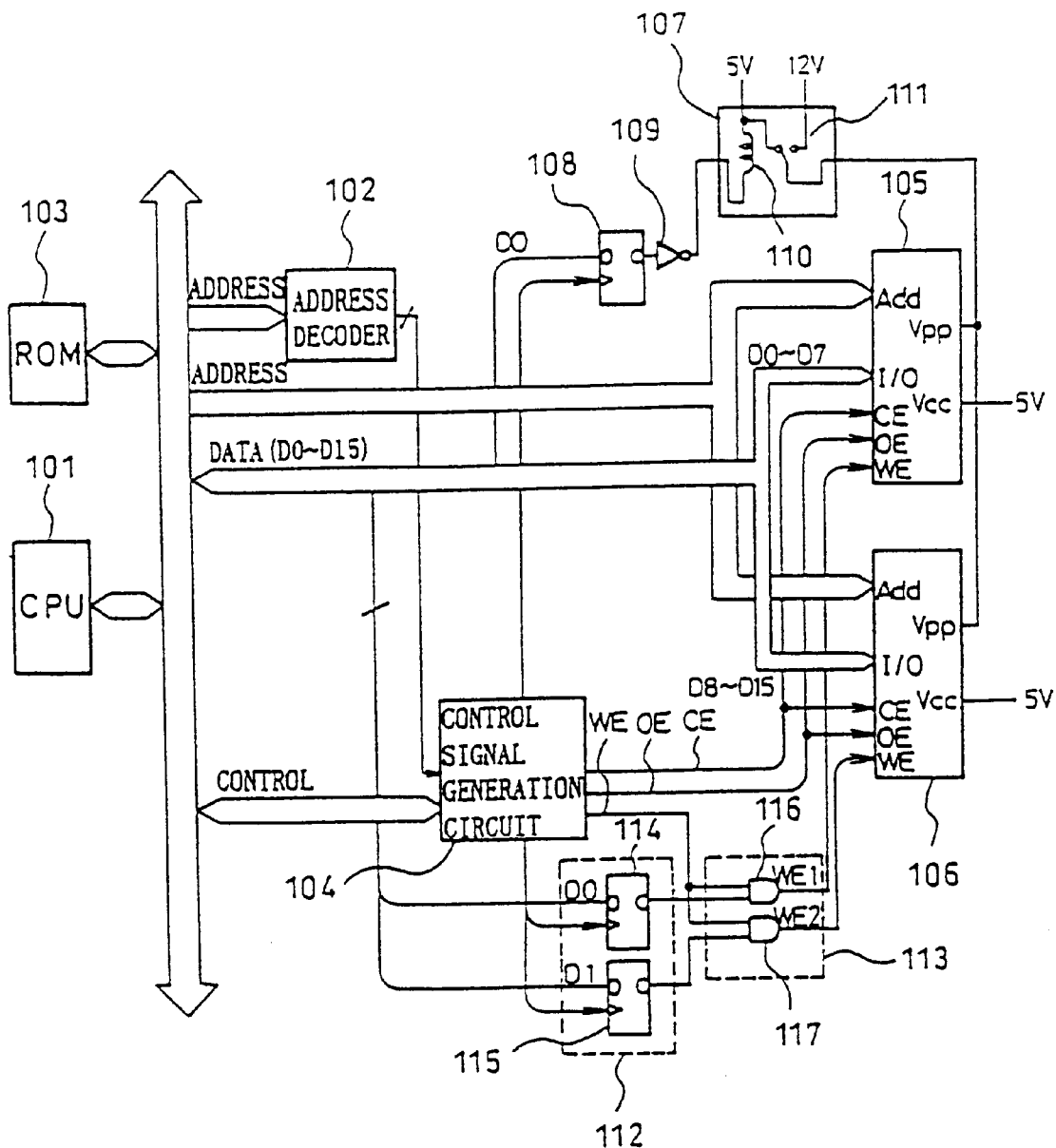
FIG. 9 is a block diagram of a non-volatile semiconductor memory device of the past.

FIG. 8 shows a block diagram of the third embodiment of a non-volatile semiconductor memory device writing apparatus according to the present invention.

FIG. 8 shows a configuration that is a combination of the configurations of the first and second embodiments. Whereas the first embodiment has an address buffer for each of the flash memories, in the third embodiment the address buffer 21 is shared by the overall flash memory. Therefore, the data of buffers 31, 32, and 33 are written into the same address of each flash memory blocks 11, 12, and 13. With this configuration, it is possible to achieve the effects of both the first and second embodiments, and also to reduce the number of address settings to one-third that of the first embodiment.

By adopting the above-noted configuration, a non-volatile semiconductor memory device writing apparatus according to the present invention prevents excessive writing into a flash memory.

What is claimed is:

1. A writing apparatus for a non-volatile semiconductor memory device, comprising:
   a flash memory;
   means for controlling the writing of data into a location of said flash memory; and
   means for verifying whether said data has been properly written into said location of said flash memory, whereby only data not having been written properly into said memory as determined by said verifying means is rewritten,
   wherein said verifying means includes an exclusive-NOR circuit which compares said data written into said flash memory with verify data and generates second write data, based on a result of said comparison, which is input into said location of said flash memory for rewriting only said data not having been properly written, said exclusive-NOR circuit including a plurality of exclusive-NOR gates equal in number to a number of bits of said write data.

2. The writing apparatus for a non-volatile semiconductor memory device according to claim 1, wherein said write data is stored in a data buffer while a data read out for being verified, is stored in a read buffer.

3. A writing apparatus for a non-volatile semiconductor memory device, said writing apparatus comprising:
   at least two independent memory blocks, each of said blocks including a predetermined number of memory cells;
   an address bus connected to said two memory blocks;
   a data bus connected to said two memory blocks;
   a writing control means for controlling the simultaneous writing of data from said data bus into said two memory blocks; and
   means for detecting whether said writing of data into said two memory blocks failed,
   whereby when writing of data has failed in only one of said two memory blocks, said writing control means rewrites only said data not having been written properly in said one failed memory block.

4. The writing apparatus for the non-volatile semiconductor device according to claim 3, wherein said writing control means writes said data from said data bus into different address locations of said two memory blocks.

5. A writing apparatus for a non-volatile semiconductor memory device in which data is written into a plurality of flash memories and written data being verified, whereby only data not having been written properly in said memory is rewritten therein, and wherein each one of said flash memories includes a data buffer to store write data, a read buffer to store read-out data and a write controlling means for simultaneously writing each data stored in said respective data buffers into said respective memories, and further wherein said writing apparatus is provided with an address buffer for designating a same address for each memory, said write controlling means being provided with a plurality of exclusive-NOR circuits the number of which being identical to that of said write data, said exclusive-NOR circuits comparing said write data with verified data and generating write data to be rewritten thereinto, based on a result of said comparison so that rewriting operation is carried out.

6. A method for writing information in a semiconductor memory, said semiconductor memory including at least two independent memory blocks, said method comprising:
   simultaneously writing data into said two memory blocks;
   verifying whether said data has been properly written into said two memory blocks;
   if data has been improperly written into one of said two memory blocks, performing a re-write operation for only said one memory block.

7. The method according to claim 6, wherein said verifying step includes:
   comparing said data written into said two memory blocks with verification data read out from said two memory blocks, respectively;
   identifying a failed write operation based on an outcome of said comparing step.

8. The method according to claim 7, wherein said comparing step includes:
   comparing said written data with said verification data on a bit-by-bit basis for each of said two memory blocks; and
   identifying one or more bits which were improperly written, and wherein said performing step includes re-writing only those bits which were improperly written as identified in said identifying step.

9. The method according to claim 8, wherein said step of comparing written data with said verification data is performed in accordance with an exclusive-NOR logical operation.

10. The method according to claim 6, further comprising:
generating an address;
transmitting the address to said two memory blocks;
simultaneously writing data into said same address of said two memory blocks.

11. The method according to claim 6, wherein said simultaneous writing step includes writing data into different address locations of said two memory blocks.

12. A writing apparatus for a non-volatile semiconductor memory device, comprising:
a flash memory;
means for controlling the writing of a write data into said flash memory; and
means for verifying whether said write data has been properly written into said flash memory, whereby only bit data not having been written properly into said memory of said write data as determined by said verifying means is rewritten,
wherein said verifying means includes an exclusive-NOR circuit which compares said write data with verify data and outputs a re-write data so as to re-write into said flash memory only said bit data not having been properly written of said write data, said exclusive-NOR circuit including a plurality of exclusive-NOR gates equal in number to a number of bits of said write data.

13. The writing apparatus for the non-volatile semiconductor memory device according to claim 12, said writing apparatus comprising:
at least two independent memory blocks, each of said blocks including a predetermined number of memory cells;
an address bus connected to said two memory blocks;
a data bus connected to said two memory blocks;
a writing control means for controlling the simultaneous writing of data from said data bus into said two memory blocks; and
means for detecting whether said writing of data into said two memory blocks failed,
whereby when writing of data has failed in only one of said two memory blocks, said writing control means rewrites only said data not having been written properly in said one failed memory block.

14. A writing apparatus for a non-volatile semiconductor memory device in which data is written into a plurality of flash memories and written data being verified, whereby only data not having been written properly in said memory is rewritten therein, and wherein each one of said flash memories includes a data buffer to store write data, a read buffer to store read-out data and a write controlling means for simultaneously writing each data stored in said respective data buffers into said respective memories, and further wherein said writing apparatus is provided with an address buffer for designating a same address for each memory, said write controlling means being provided with a plurality of exclusive-NOR circuits the number of which being identical to that of said write data, said exclusive-NOR circuits comparing said write data with verified data and outputting re-write data so as to re-write into said flash memory only bit data not having been properly written of said write data, based on a result of said comparison so that rewriting operation is carried out.

15. A method for writing data in a semiconductor memory, said semiconductor memory including at least two independent memory blocks and a plurality of exclusive-NOR circuits equal in number to a number of bits of said data for each memory block, said method comprising:
simultaneously writing data into two memory blocks;
verifying whether said data has been properly written into said two memory blocks; and
if data has not been properly written into one of said two memory blocks, said exclusive-NOR circuits output re-write data for re-writing into only said one memory block only bit data not having been properly written of said data.

* * * * *